(12) United States Patent
Kim et al.

(10) Patent No.: US 11,631,727 B2
(45) Date of Patent: Apr. 18, 2023

(54) THIN-FILM TRANSISTOR SUBSTRATE HAVING A THIN-FILM LAYER INCLUDING AMORPHOUS SILICON DISPOSED BETWEEN A FIRST ELECTRODE AND A SECOND ELECTRODE OF A STORAGE CAPACITOR AND DISPLAY APPARATUS COMPRISING THE SAME

(71) Applicant: SAMSUNG DISPLAY CO., LTD., Yongin-si (KR)

(72) Inventors: Keunwoo Kim, Yongin-si (KR); Taewook Kang, Yongin-si (KR); Doona Kim, Yongin-si (KR); Bummo Sung, Yongin-si (KR); Dokyeong Lee, Yongin-si (KR); Jaehwan Chu, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 150 days.

(21) Appl. No.: 17/134,595

(22) Filed: Dec. 28, 2020

(65) Prior Publication Data
US 2021/0288123 A1     Sep. 16, 2021

(30) Foreign Application Priority Data
Mar. 11, 2020   (KR) .................. 10-2020-0030376

(51) Int. Cl.
*H01L 29/08*   (2006.01)
*H01L 27/32*   (2006.01)
*H01L 29/786*  (2006.01)

(52) U.S. Cl.
CPC ...... *H01L 27/3262* (2013.01); *H01L 27/3265* (2013.01); *H01L 27/3276* (2013.01); *H01L 29/78663* (2013.01); *H01L 29/78693* (2013.01)

(58) Field of Classification Search
CPC ............. H01L 27/3262; H01L 27/3265; H01L 27/3276; H01L 29/78663; H01L 29/78693
USPC .......................................... 257/40
See application file for complete search history.

(56) References Cited

U.S. PATENT DOCUMENTS

| 6,762,082 B2 | 7/2004 | Yamazaki et al. |
| 6,980,262 B2 | 12/2005 | Song |
| 10,482,817 B2 | 11/2019 | Kim et al. |

(Continued)

FOREIGN PATENT DOCUMENTS

| KR | 10-0864230 | 2/2009 |
| KR | 10-0917766 | 9/2009 |

(Continued)

*Primary Examiner* — Phuc T Dang
(74) *Attorney, Agent, or Firm* — F. Chau & Associates, LLC

(57) ABSTRACT

A thin-film transistor substrate includes a semiconductor layer disposed on a substrate, a gate insulating layer disposed on the semiconductor layer, a first electrode that at least partly overlaps the semiconductor layer, wherein the gate insulating layer is disposed between the first electrode and the semiconductor layer, a plurality of thin-film layers disposed on the first electrode, and a second electrode that at least partly overlaps the first electrode, wherein the plurality of thin-film layers are disposed between the second electrode and the first electrode, wherein at least one of the plurality of thin-film layers includes amorphous silicon.

19 Claims, 14 Drawing Sheets

(56) References Cited

U.S. PATENT DOCUMENTS

| | | | |
|---|---|---|---|
| 2007/0247558 A1* | 10/2007 | Lin | G02F 1/136213 349/43 |
| 2011/0124173 A1* | 5/2011 | Kim | H01L 29/6653 438/305 |
| 2016/0064462 A1* | 3/2016 | Yoon | H01L 29/78645 257/40 |
| 2016/0322450 A1* | 11/2016 | Lee | H01L 27/3262 |
| 2018/0061920 A1* | 3/2018 | Son | H01L 29/66969 |
| 2019/0206328 A1 | 7/2019 | Park | |

FOREIGN PATENT DOCUMENTS

| | | |
|---|---|---|
| KR | 10-1341850 | 12/2013 |
| KR | 10-2019-0081477 | 7/2019 |

\* cited by examiner

THIN-FILM TRANSISTOR SUBSTRATE HAVING A THIN-FILM LAYER INCLUDING AMORPHOUS SILICON DISPOSED BETWEEN A FIRST ELECTRODE AND A SECOND ELECTRODE OF A STORAGE CAPACITOR AND DISPLAY APPARATUS COMPRISING THE SAME

CROSS-REFERENCE TO RELATED APPLICATION

This application claims priority under 35 U.S.C. § 119 from, and the benefit of Korean Patent Application No. 10-2020-0030376, filed on Mar. 11, 2020 in the Korean Intellectual Property Office, the contents of which are herein incorporated by reference in their entirety.

BACKGROUND

1. Technical Field

One or more embodiments are directed to a thin-film transistor substrate and a display apparatus including the same, and more particularly, to a thin-film transistor substrate with enhanced high-speed pixel circuit driving and lower pixel brightness, and a display apparatus including the same.

2. Discussion of the Related Art

Display apparatuses visually display data. A display apparatus may be used as a display for a small product, such as a mobile phone, or a display for a large product, such as a television (TV).

A display apparatus includes a plurality of pixels that receive electrical signals and emit light to display an image. Each of the plurality of pixels includes a light-emitting device. For example, in the case of an organic light-emitting display apparatus, each pixel includes an organic light-emitting diode as a light-emitting device. In general, organic light-emitting display apparatuses operate with a thin-film transistor and an organic light-emitting diode formed on a substrate, in which the organic light-emitting diode emits light by itself.

Recently, the usage of display apparatuses has diversified, and thus various designs for enhancing the quality of display apparatuses have been attempted.

SUMMARY

One or more embodiments provide a thin-film layer that includes amorphous silicon (a-Si) disposed between a first electrode and a second electrode of a storage capacitor. Thus, the storage capacitor has a variable capacitance, and one or more embodiments provide a thin-film transistor substrate that has enhanced high-speed pixel circuit driving can maintain brightness substantially constant, and a display apparatus including the same.

According to one or more embodiments, a thin-film transistor substrate includes a semiconductor layer disposed on a substrate, a gate insulating layer disposed on the semiconductor layer, a first electrode that at least partly overlaps the semiconductor layer, wherein the gate insulating layer is disposed between the first electrode and the semiconductor layer, a plurality of thin-film layers disposed on the first electrode, and a second electrode that at least partly overlaps the first electrode, wherein the plurality of thin-film layers are disposed between the second electrode and the first electrode, wherein at least one of the plurality of thin-film layers includes amorphous silicon.

The plurality of thin-film layers may include a first thin-film layer, a second thin-film layer, and a third thin-film layer that are sequentially stacked, and the second thin-film layer may include amorphous silicon.

The first thin-film layer and the third thin-film layer may include different materials from each other.

The first thin-film layer and the third thin-film layer may include the same material.

The plurality of thin-film layers may include a first thin-film layer and a second thin-film layer that are sequentially stacked, and one of the first thin-film layer or the second thin-film layer may include amorphous silicon.

Excluding a thin-film layer that includes amorphous silicon, the other thin-film layers may include silicon oxide or silicon nitride.

A capacitance of the storage capacitor that includes the first electrode and the second electrode may vary.

When a voltage is charged to the first electrode, the capacitance of the storage capacitor may decrease.

The thin-film transistor substrate may further include a thin-film transistor that includes the semiconductor layer and the first electrode as a gate electrode, and a storage capacitor that includes the first electrode and the second electrode, where the thin-film transistor and the storage capacitor may overlap, and the gate electrode may have an isolated shape.

The semiconductor layer may include a silicon semiconductor material or an oxide semiconductor material.

According to one or more embodiments, a display apparatus includes a storage capacitor, a thin-film transistor, and a display element electrically connected to the thin-film transistor that are arranged on a substrate, wherein the storage capacitor includes a first electrode and a second electrode that at least partly overlap each other, and a plurality of thin-film layers may be disposed between the first electrode and the second electrode, and at least one of the plurality of thin-film layers may include amorphous silicon.

When the display element emits light, capacitance of the storage capacitor may increase, and when a voltage is charged to the first electrode, the capacitance of the storage capacitor may decrease.

A first capacitance of the storage capacitor when a voltage is charged to the thin-film transistor may be less than a second capacitance of the storage capacitor when the display element emits light.

The thin-film transistor may include a semiconductor layer and a gate electrode, the thin-film transistor may overlap the storage capacitor, and the gate electrode may function as the first electrode.

The plurality of thin-film layers may include a first thin-film layer, a second thin-film layer, and a third thin-film layer that are sequentially stacked, and the second thin-film layer may include amorphous silicon.

The first thin-film layer and the third thin-film layer may include different materials from each other or the same material.

Excluding a thin-film layer that includes amorphous silicon, the other thin-film layers may include silicon oxide or silicon nitride.

The plurality of thin-film layers may include a first thin-film layer and a second thin-film layer that are sequentially stacked, and one of the first thin-film layer or the second thin-film layer may include amorphous silicon.

According to one or more embodiments, a thin-film transistor substrate includes a thin-film transistor that includes a semiconductor layer and a gate electrode, a plurality of thin-film layers disposed on the gate electrode; and a second electrode disposed on the plurality of thin-film layers wherein the second electrode at least partly overlaps the gate electrode, where at least one of the plurality of thin-film layers comprises amorphous silicon, and the other thin-film layers comprise silicon oxide or silicon nitride.

The gate electrode may form a storage capacitor with the second electrode, and the capacitance of the storage capacitor may vary.

Other aspects, features, and advantages than the above-described aspects, features, and advantages will be apparent from the following drawings, the claims, and a detailed description of the disclosure.

DETAILED DESCRIPTION

Figure 1:
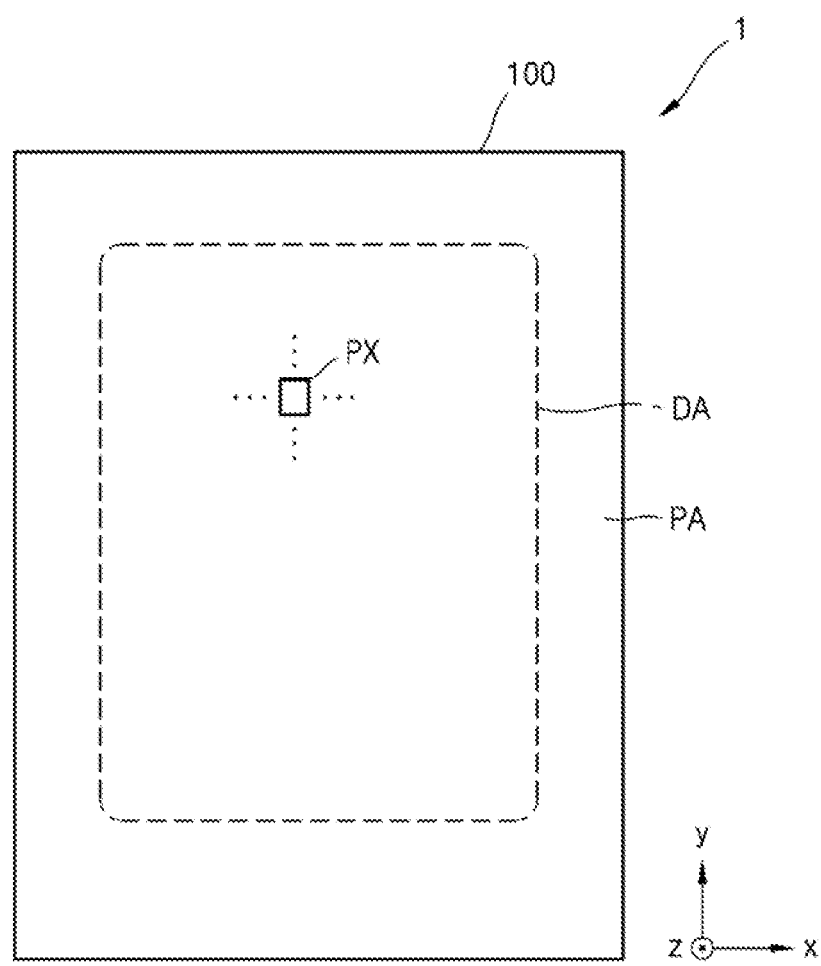
FIG. 1 is a plan view of a display apparatus according to an embodiment.

Reference will now be made in detail to exemplary embodiments, examples of which are illustrated in the accompanying drawings, wherein like reference numerals may refer to like elements throughout. In this regard, exemplary embodiments may have different forms and should not be construed as being limited to the descriptions set forth herein.

Hereinafter, exemplary embodiments of the present disclosure will be described below in more detail with reference to the accompanying drawings. Those components that are the same or are in correspondence may have the same reference numeral regardless of the figure number, and a redundant description therewith is omitted.

Sizes of elements in the drawings may be exaggerated or reduced for convenience of explanation.

It will be understood that when a layer, region, or component is referred to as being "connected to," another layer, region, or component, it may be directly or indirectly connected to the other layer, region, or component.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Hereinafter, embodiments of the present disclosure will be described in more detail with reference to the accompanying drawings.

FIG. 1 is a plan view of a display apparatus according to an embodiment.

Referring to FIG. 1, according to an embodiment, a display apparatus 1 includes a display area DA in which an image can be displayed, and a peripheral area PA around the display area DA. The display apparatus 1 displays an image by using light emitted from the display area DA.

A substrate 100 may be formed of various materials, such as glass, metal, plastic, and the like. In an embodiment, the substrate 100 includes a flexible material. Here, the flexible material refers to a substrate that can be bent, folded or rolled. The substrate 100 made of a flexible material includes ultra-thin glass, metal, or plastic.

According to an embodiment, pixels PX that include various display elements, such as an organic light-emitting diode OLED, etc., are arranged in the display area DA of the substrate 100. A plurality of pixels PX are provided. The plurality of pixels PX may be arranged in various forms, such as a stripe arrangement, a pen-tile arrangement, a mosaic arrangement, etc., so as to display an image.

When the display area DA is viewed in a plan view, the display area DA has a rectangular shape, as shown in FIG. 1. In another embodiment, the display area DA may have a polygonal shape, such as a triangular shape, a pentagonal shape, or a hexagonal shape, a circular shape, an elliptical shape, or an irregular shape.

According to an embodiment, the peripheral area PA of the substrate 100 surrounds the display area DA, and is an area in which no image is displayed. Various wirings for transmitting electrical signals to the display area DA and pads to which a printed circuit board or a driver integrated circuit (IC) chip is attached, are located in the peripheral area PA.

Figure 2:
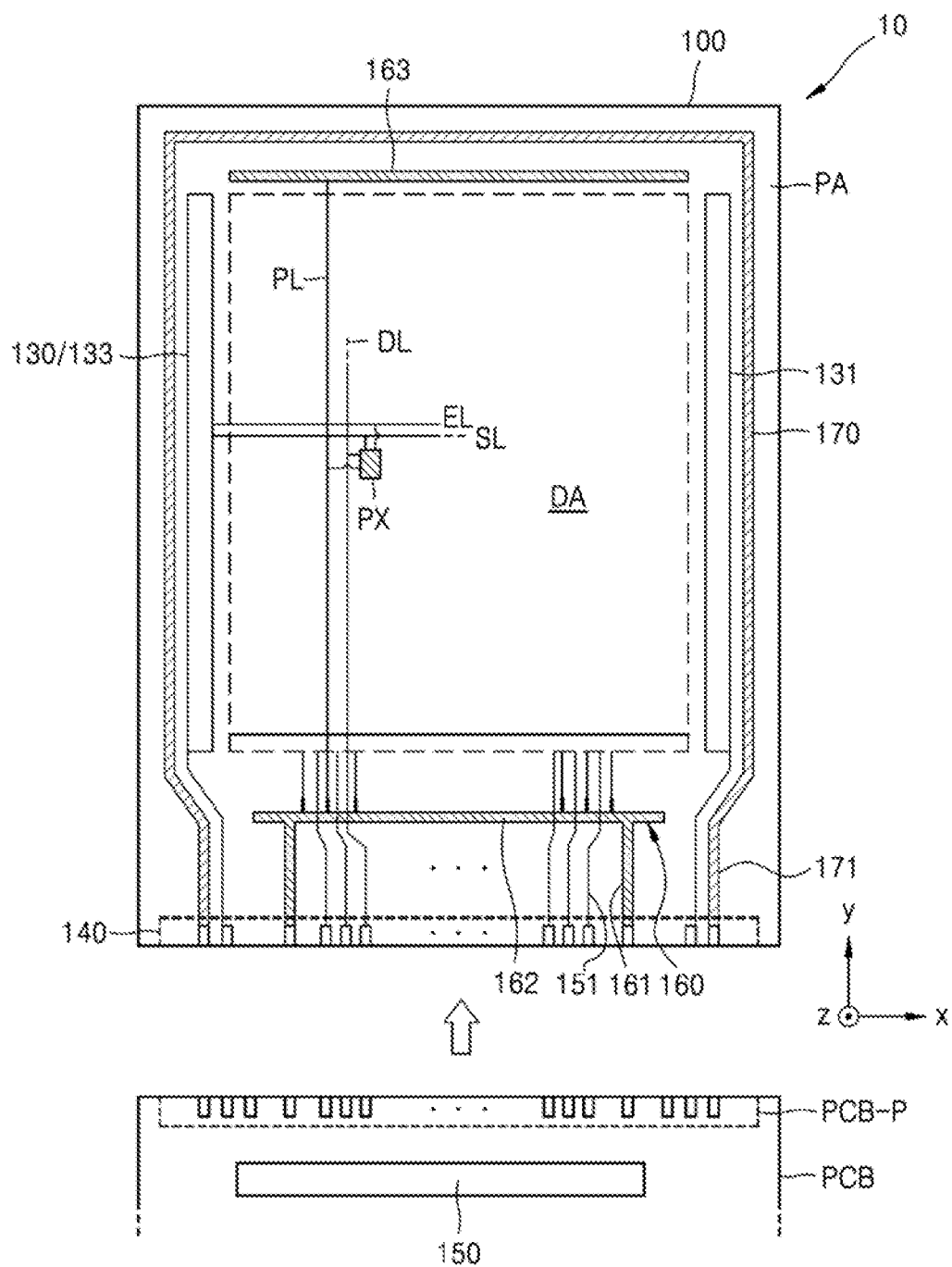
FIG. 2 is a plan view of a display panel according to an embodiment.

FIG. 2 is a plan view schematically illustrating a display panel according to an embodiment.

Referring to FIG. 2, according to an embodiment, the display panel 10 includes the display area DA and the peripheral area PA, and the plurality of pixels PX arranged in the display area DA. Each of the plurality of pixels PX includes a display element, such as the organic light-emitting diode OLED. Each pixel PX may emit red, green, blue or white light, for example, from the organic light-emitting diode OLED. Hereinafter, in the present specification, each pixel PX refers to a sub-pixel that emits light of different colors. Each pixel PX is one of a red (R) sub-pixel, a green (G) sub-pixel, and a blue (B) sub-pixel, for example. The display area DA is covered with an encapsulation member and protected from external air or moisture.

According to an embodiment, each pixel PX is electrically connected to outer circuits disposed in the peripheral area PA. A first scan driving circuit 130, a second scan driving circuit 131, an emission control driving circuit 133, a terminal 140, a data driving circuit 150, a first power supply line 160, and a second power supply line 170 are disposed in the peripheral area PA.

According to an embodiment, each of the first scan driving circuit 130 and the second scan driving circuit 131 provide scan signals to each pixel PX through scan lines SL.

The first scan driving circuit 130 and the second scan driving circuit 131 are spaced apart from each other in an x-direction and extend parallel with each other in a y-direction with the display area DA therebetween. Part of the pixels PX in the display area DA are electrically connected to the first scan driving circuit 130, and the other thereof are connected to the second scan driving circuit 131. In another embodiment, the second scan driving circuit 131 is omitted.

According to an embodiment, the emission control driving circuit 133 provides an emission control signal to each pixel PX through an emission control line EL.

According to an embodiment, the terminal 140 is located at one side of the substrate 100. The terminal 140 is not covered by an insulating layer but is exposed and electrically connected to a printed circuit board PCB. A terminal PCB-P of the printed circuit board PCB is electrically connected to the terminal 140 of the display panel 10. The printed circuit board PCB transmits signals or power from a controller to the display panel 10.

According to an embodiment, a control signal generated by the controller is transmitted to each of the first and second scan driving circuits 130 and 131 through the printed circuit board PCB. The controller provides first and second power supply voltages to the first and second power supply lines 160 and 170, respectively, through first and second connection lines 161 and 171. The first power supply voltage is provided to each pixel PX via a driving voltage line PL connected to the first power supply line 160, and the second power supply voltage is provided to an opposite electrode (see 230 of FIG. 7 to be described below) of each pixel PX connected to the second power supply line 170.

According to an embodiment, the data driving circuit 150 is electrically connected to a data line DL. A data signal of the data driving circuit 150 is provided to each pixel PX via a connection line 151 connected to the terminal 140 and the data line DL connected to the connection line 151. FIG. 2 illustrates that the data driving circuit 150 is located on the printed circuit board PCB. However, in another embodiment, the data driving circuit 150 is located on the substrate 100. For example, the data driving circuit 150 may be located between the terminal 140 and the first power supply line 160.

According to an embodiment, the first power supply line 160 includes a first sub-line 162 and a second sub-line 163 that are spaced apart in the y-direction and extend parallel with each other in the x-direction, with the display area DA located between the first sub-line 162 and the second sub-line 163. The second power supply line 170 has a loop shape with one open side and that partially surrounds the display area DA.

Figure 3A:
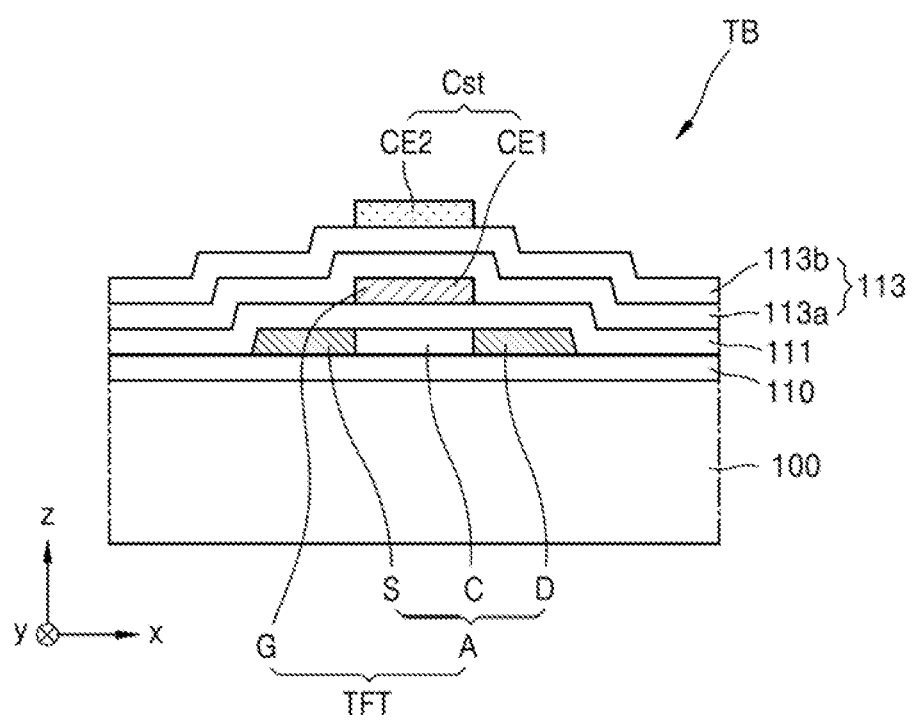
FIGS. 3A and 3B are cross-sectional views that schematically illustrate part of a thin-film transistor substrate included in a display apparatus according to embodiments.
Figure 3B:
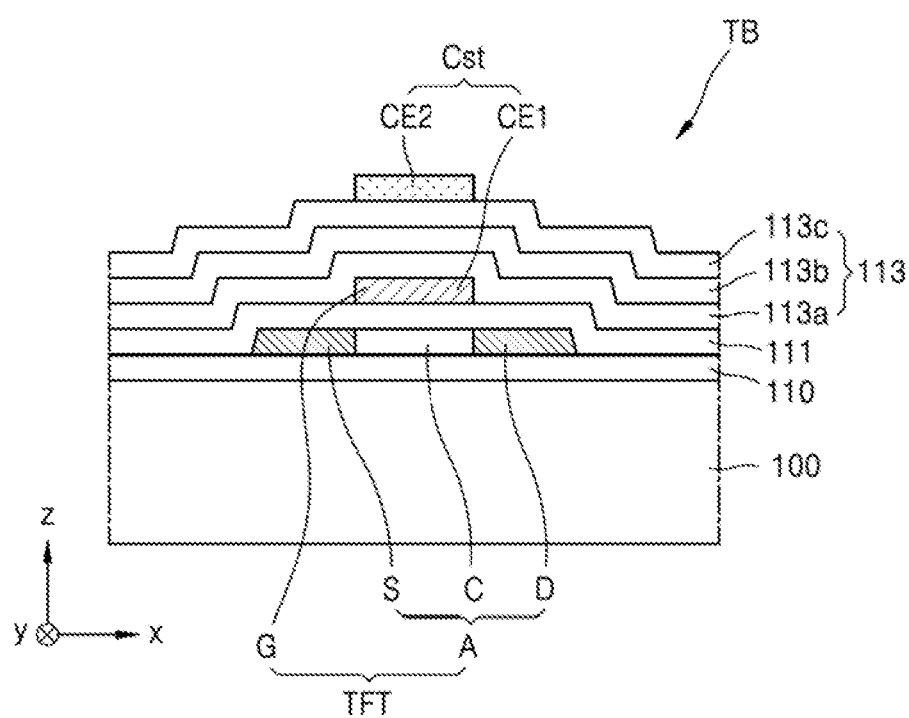

FIGS. 3A and 3B are cross-sectional views that schematically illustrate part of a thin-film transistor substrate included in a display apparatus according to embodiments. FIG. 3B corresponds to some modified embodiments of FIG. 3A and will be described based on FIG. 3A, and FIG. 3B will be mainly described with respect to differences from FIG. 3A.

Referring to FIG. 3A, a thin-film transistor substrate TB according to an embodiment includes a thin-film transistor TFT having a semiconductor layer A and a gate electrode G, and a storage capacitor Cst having a first electrode CE1 and a second electrode CE2.

According to an embodiment, the semiconductor layer A has a channel region C, a source region S, and a drain region D. A plurality of thin-film layers 113 are disposed between the first electrode CE1 and the second electrode CE2 of the storage capacitor Cst. In this case, at least one of the plurality of thin-film layers 113 includes amorphous silicon (a-Si).

Hereinafter, a configuration included in the thin-film transistor substrate TB will be described according to a stack order in more detail with reference to FIG. 3A.

According to an embodiment, the substrate 100 may include a glass material, a ceramic material, a metallic material, or a flexible or bendable material. The substrate 100 may have a single layer or multi-layer structure. When the substrate 100 has a multi-layer structure, the substrate 100 further includes an inorganic layer. In some embodiments, the substrate 100 has a multi-layer structure of an organic material/inorganic material/organic material.

According to an embodiment, a buffer layer 110 that reduces or blocks penetration of foreign substances, moisture or external air from a lower portion of the substrate 100 is disposed on the substrate 100 and provides a flat surface to the substrate 100. The buffer layer 110 may include an inorganic material such as oxide or nitride, an organic material, or an organic/inorganic composite material, and may have a single layer or multi-layer structure of an inorganic material and an organic material.

According to an embodiment, the semiconductor layer A includes low temperature poly-silicon (LTPS). A poly-silicon material has high electron mobility (100 cm$^2$Vs or more), low energy power consumption and high reliability. In another embodiment, the semiconductor layer A includes amorphous silicon (a-Si) or an oxide semiconductor.

According to an embodiment, a gate insulating layer 111 is positioned on the semiconductor layer A and the buffer layer 110. The gate insulating layer 111 may include silicon oxide ($SiO_x$), silicon nitride ($SiN_x$), silicon oxynitride (SiON), aluminum oxide ($Al_2O_3$), or zinc oxide ($ZnO_2$).

According to an embodiment, a gate electrode G is positioned on the gate insulating layer 111 so that at least part of the gate electrode G overlaps the semiconductor layer A.

In an embodiment, the storage capacitor Cst includes the first electrode CE1 and the second electrode CE2, and overlaps the thin-film transistor TFT, as shown in FIG. 3A. For example, the gate electrode G of the thin-film transistor TFT functions as the first electrode CE1 of the storage capacitor Cst. Alternatively, in another embodiments, the storage capacitor Cst does not overlap the thin-film transistor TFT but is separately constituted.

According to an embodiment, the gate electrode G of the thin-film transistor TFT, the first electrode CE1 of the storage capacitor Cst, and the second electrode CE2 of the storage capacitor Cst include at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu), and may have a single layer or multi-layer structure.

According to an embodiment, the second electrode CE2 of the storage capacitor Cst overlaps the first electrode CE1 with a plurality of thin-film layers 113 disposed between the second electrode CE2 and the first electrode CE1, and forms a capacitor with the first electrode CE1. In this case, the plurality of thin-film layers 113 function as a dielectric layer of the storage capacitor Cst.

As shown FIG. 3A, according to an embodiment, the thin-film layers 113 include two layers, a first thin-film layer 113a and a second thin-film layer 113b, and at least one of the first thin-film layer 113a and the second thin-film layer 113b includes amorphous silicon (a-Si).

In addition, according to an embodiment, excluding the thin-film layer 113 that includes amorphous silicon (a-Si), the other thin-film layers 113 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

In an embodiment, the first thin-film layer 113a includes amorphous silicon (a-Si), and the second thin-film layer 113b includes silicon oxide ($SiO_x$) or silicon nitride ($SiN_x$). In another embodiment, the first thin-film layer 113a may include silicon oxide ($SiO_x$) or silicon nitride ($SiN_x$), and the second thin-film layer 113b includes amorphous silicon (a-Si).

In another embodiment, as shown in FIG. 3B, the thin-film layers 113 includes three layers, the first thin-film layer 113a, the second thin-film layer 113b, and a third thin-film layer 113c. At least one of the first thin-film layer 113a, the second thin-film layer 113b, and the third thin-film layer 113c includes amorphous silicon (a-Si). In addition, excluding the thin-film layer 113 that includes amorphous silicon (a-Si), the other thin-film layers 113 may include different materials or the same material.

In an embodiment, the second thin-film layer 113b includes amorphous silicon (a-Si), the first thin-film layer 113a includes silicon oxide ($SiO_x$), and the third thin-film layer 113c includes silicon nitride ($SiN_x$).

In another embodiment, the second thin-film layer 113b includes a-Si, and the first thin-film layer 113a and the third thin-film layer 113c include silicon oxide ($SiO_x$) or silicon nitride ($SiN_x$).

In FIGS. 3A and 3B, according to an embodiment, the thin-film layers 113 include two or three thin-film layers 113. However, in other embodiments, the thin-film layers 113 may include four or more thin-film layers 113, and at least one of the plurality of thin-film layers 113 includes amorphous silicon (a-Si). In an embodiment, the thin-film layers 113 include five thin-film layers 113.

In an embodiment, the plurality of thin-film layers 113 are disposed between the first and second electrodes CE1 and CE2 of the storage capacitor Cst, and at least one of the plurality of thin-film layers 113 includes amorphous silicon (a-Si). In this case, when a pixel circuit PC (see FIG. 4) is driven, the capacitance of the storage capacitor Cst varies. For example, when the organic light-emitting diode OLED emits light, the capacitance of the storage capacitor Cst increases, and a brightness of the organic light-emitting diode OLED, close to 100% can be maintained as an emission period progresses.

Figure 4:
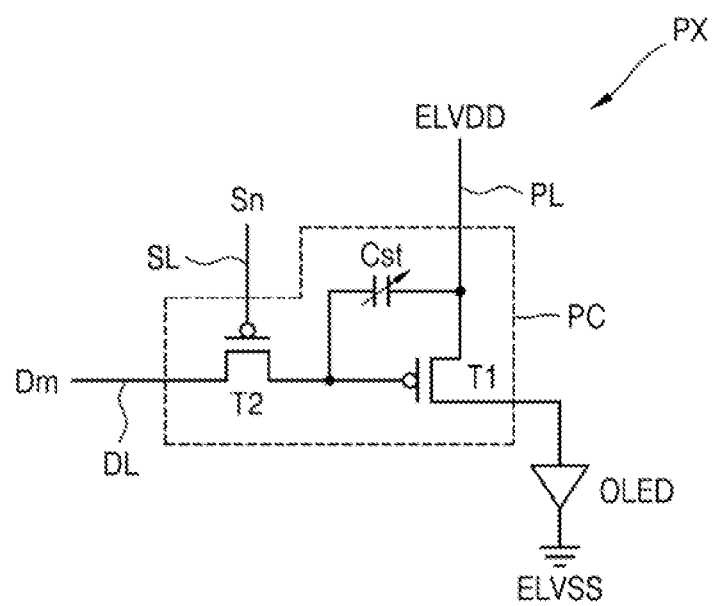
FIG. 4 is an equivalent circuit diagram of one pixel of a display apparatus according to an embodiment.

FIG. 4 is an equivalent circuit diagram of one pixel of a display apparatus according to an embodiment.

Referring to FIG. 4, according to an embodiment, each pixel PX includes a pixel circuit PC connected to a scan line SL and a data line DL, and an organic light-emitting diode OLED connected to the pixel circuit PC.

According to an embodiment, the pixel circuit PC includes a driving thin-film transistor (TFT) T1, a switching thin-film transistor (TFT) T2, and a storage capacitor Cst. The switching TFT T2 is connected to the scan line SL and the data line DL and transmits a data signal Dm received through the data line DL to the driving TFT T1 according to a scan signal Sn received through the scan line SL.

According to an embodiment, the storage capacitor Cst is connected to the switching TFT T2 and a driving voltage line PL, and stores a voltage that corresponds to a difference between a voltage received from the switching TFT T2 and a driving voltage ELVDD received through the driving voltage line PL.

According to an embodiment, the driving TFT T1 is connected to the driving voltage line PL and the storage capacitor Cst and controls a driving current that flows through the organic light-emitting diode OLED from the driving voltage line PL in correspondence with a voltage value stored in the storage capacitor Cst. The organic light-emitting diode OLED emits light with a certain brightness due to the driving current.

In an embodiment, the capacitance of the storage capacitor Cst in the pixel circuit PC can vary. For example, the storage capacitor Cst has a first capacitance when storing the voltage corresponding to the difference between the voltage received from the switching TFT T2 and the driving voltage ELVDD received from the driving voltage line PL. In addition, the storage capacitor Cst has a second capacitance when the organic light-emitting diode OLED emits light with a certain brightness due to the driving current.

In an embodiment, the first capacitance of the storage capacitor Cst and the second capacitance of the storage capacitor Cst differ from each other. In an embodiment, the first capacitance of the storage capacitor Cst is less than the second capacitance of the storage capacitor Cst.

In FIG. 4, the pixel circuit PC includes two thin-film transistors and one storage capacitor. However, embodiments are not limited thereto. For example, in other embodiments, the pixel circuit PC may include three or more thin-film transistors and/or two or more storage capacitors. In an embodiment, the pixel circuit PC includes seven thin-film transistors and one storage capacitor. This will be described in FIG. 5.

Figure 5:
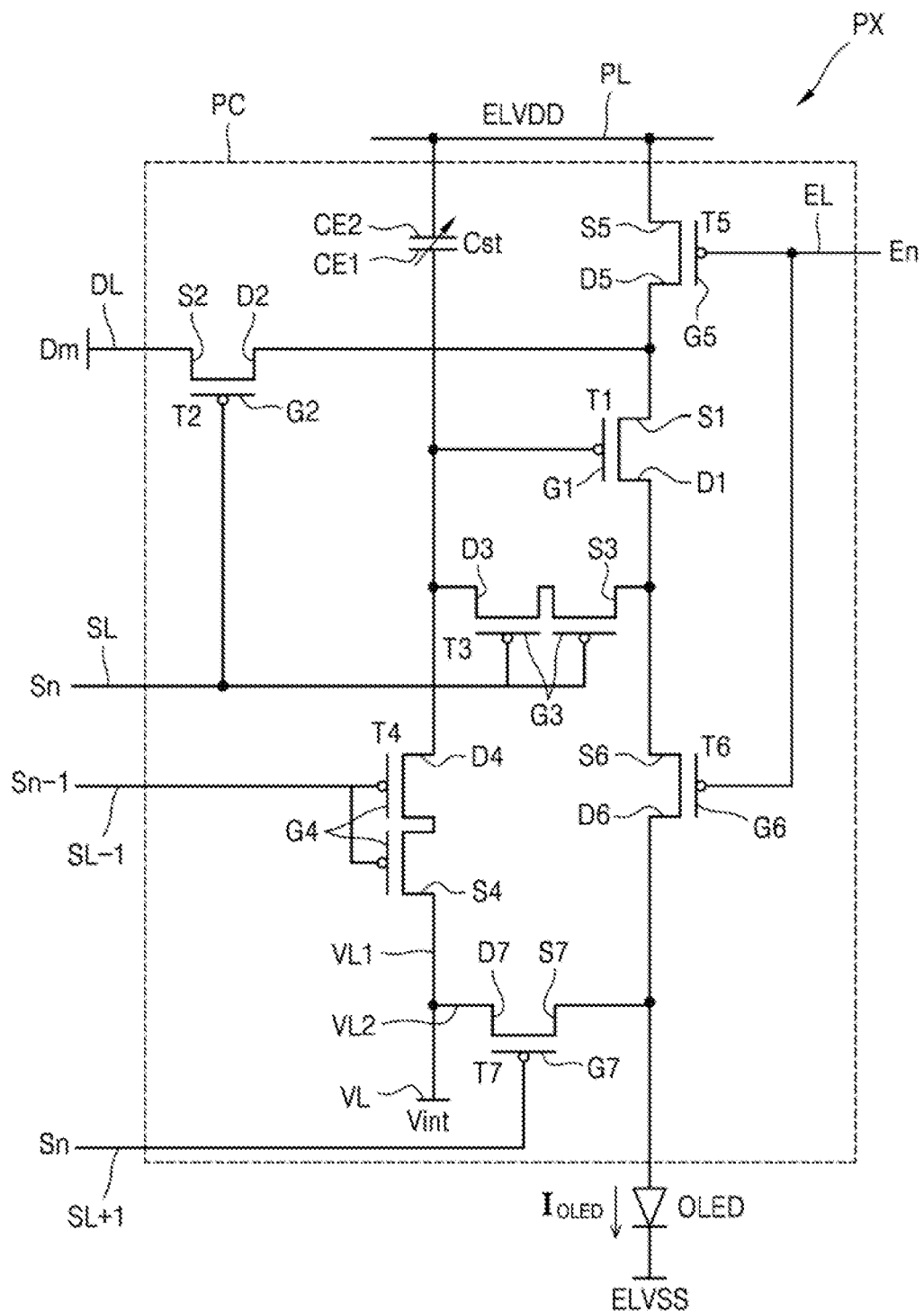
FIG. 5 is an equivalent circuit diagram of one pixel of a display apparatus according to an embodiment.
Figure 6:
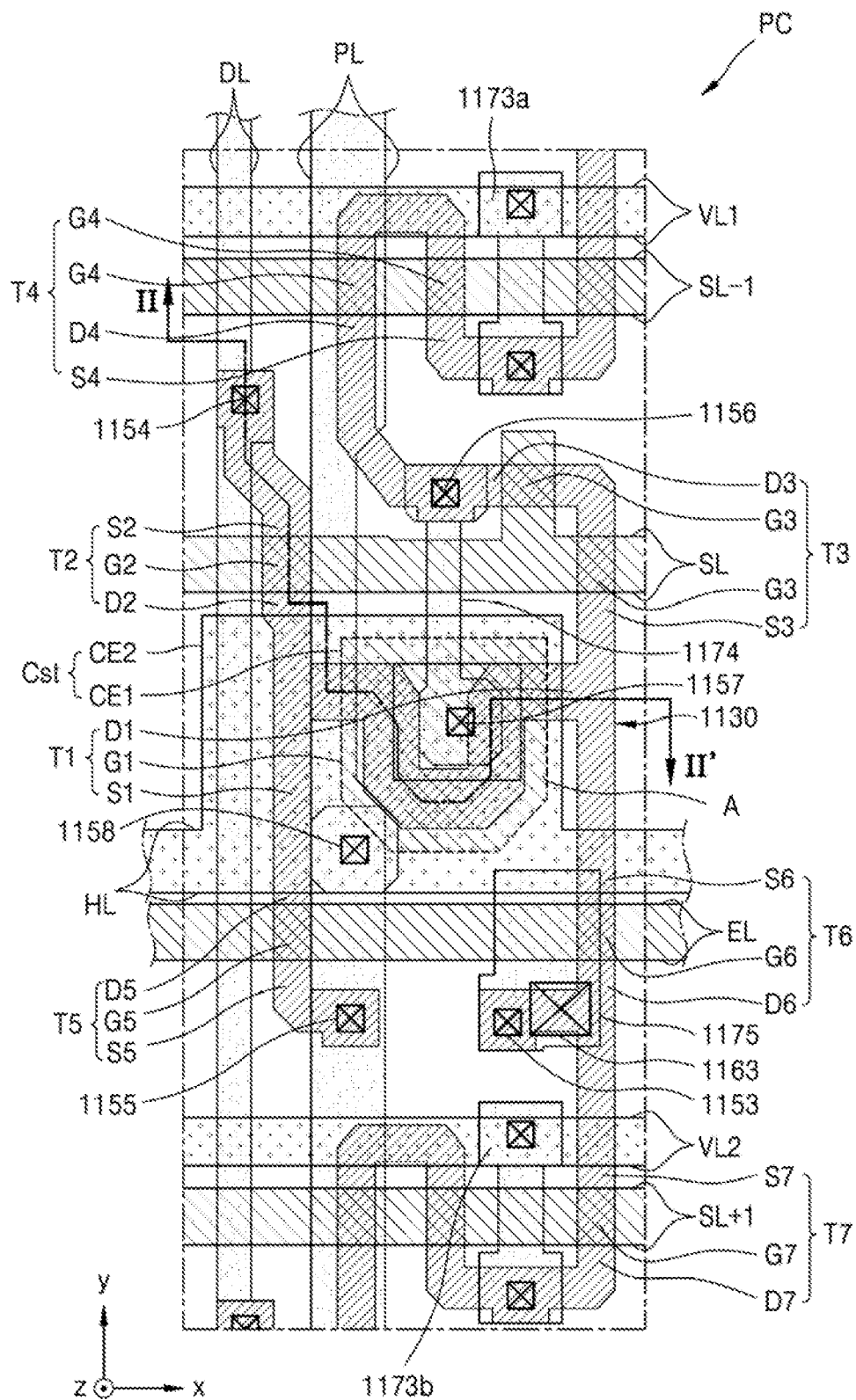
FIG. 6 is a plan view of one pixel circuit of a display apparatus according to an embodiment.
Figure 7:
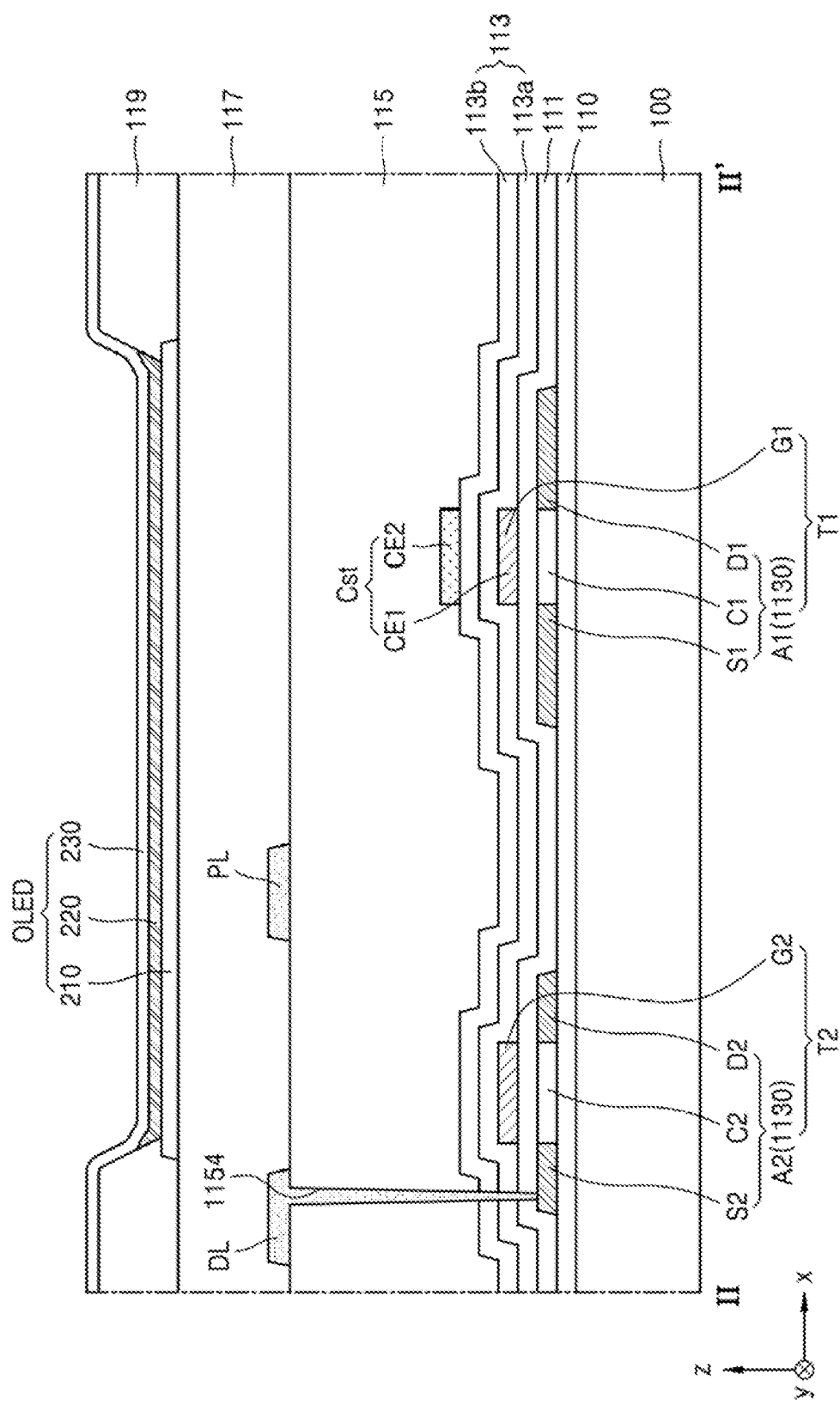
FIG. 7 is a schematic cross-sectional view of a display apparatus taken along line II-II' of FIG. 6.
Figure 8:
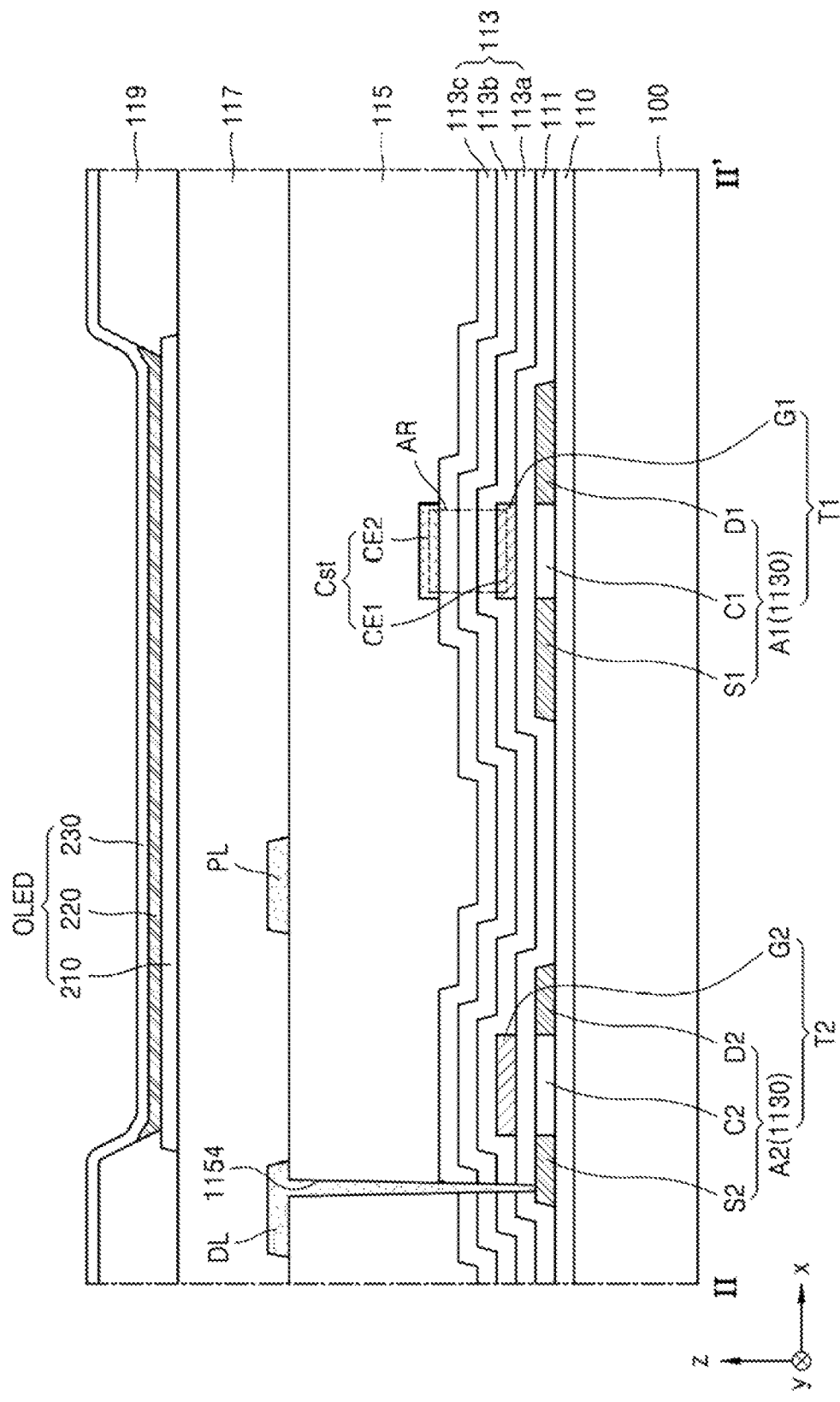
FIG. 8 is a schematic cross-sectional view of a display apparatus taken along line II-II' of FIG. 6.

FIG. 5 is an equivalent circuit diagram of one pixel of a display apparatus according to an embodiment, and FIG. 6 is an equivalent circuit diagram of one pixel circuit of a display apparatus according to an embodiment. In addition, FIGS. 7 and 8 are schematic cross-sectional views of a display apparatus taken along line II-II' of FIG. 6.

Referring to FIGS. 5 and 6, according to an embodiment, one pixel circuit PX includes a pixel circuit PC, and an organic light-emitting diode OLED electrically connected to the pixel circuit PC.

In an embodiment, the pixel circuit PC includes a plurality of thin-film transistors (TFTs) T1 through T7 and a storage capacitor Cst, as shown in FIG. 5. The plurality of TFTs T1 through T7 and the storage capacitors Cst are connected to signal lines SL, SL−1, SL+1, EL, and DL, a first initialization voltage line VL1, a second initialization voltage line VL2, and a driving voltage line PL.

According to an embodiment, the signal lines SL, SL−1, SL+1, EL, and DL include a scan line SL that transmits a scan signal Sn, a previous scan line SL−1 that transmits a previous scan signal Sn−1 to a first initialization TFT T4, a subsequent scan line SL+1 that transmits the scan signal Sn to a second initialization TFT T7, an emission control line EL that transmits an emission control signal En to an operation control TFT T5 and an emission control TFT T6, and a data line DL that crosses the scan line SL and transmits a data signal Dm. The driving voltage line PL transmits a driving voltage ELVDD to the driving TFT T1, and the first initialization voltage line VL1 transmits an initialization voltage Vint to the first initialization TFT T4, and the second initialization voltage line VL2 transmits the initialization voltage Vint to the second initialization TFT T7.

According to an embodiment, a+ driving gate electrode G1 of the driving TFT T1 is connected to the first electrode CE1 of the storage capacitor Cst, a driving source electrode S1 of the driving TFT T1 is connected to the driving voltage line PL via the operation control TFT T5, and a driving drain electrode D1 of the driving TFT T1 is electrically connected to a pixel electrode (see 210 of FIG. 6) of a organic light-emitting diode OLED via the emission control TFT T6. The driving TFT T1 receives the data signal Dm according to a switching operation of the switching TFT T2 and supplies a driving current $I_{OLED}$ to the organic light-emitting diode OLED.

According to an embodiment, a switching gate electrode G2 of the switching TFT T2 is connected to the scan line SL, a switching source electrode S2 of the switching TFT T2 is connected to the data line DL, and a switching drain electrode D2 of the switching TFT T2 is connected to the driving source electrode S1 of the driving TFT T1 and is connected to the driving voltage line PL via the operation control TFT T5. The switching TFT T2 is turned on according to the scan signal Sn received through the scan line SL and performs a switching operation of transmitting the data signal Dm received from the data line DL to the driving source electrode S1 of the driving TFT T1.

According to an embodiment, a compensation gate electrode G3 of a compensation TFT T3 is connected to the scan line SL, a compensation source electrode S3 of the compensation TFT T3 is connected to the driving drain electrode D1 of the driving TFT T1 and is connected to the pixel electrode 210 of the organic light-emitting diode OLED via the emission control TFT T6, and a compensation drain electrode D3 of the compensation TFT T3 is connected to the first electrode CE1 of the storage capacitor Cst, a first initialization drain electrode D4 of the first initialization TFT T4, and the driving gate electrode G1 of the driving TFT T1. The compensation TFT T3 is turned on according to the scan signal Sn received from the scan line SL and electrically connects the driving gate electrode G1 of the driving TFT T1 to the driving drain electrode D1, thereby diode-connecting the driving TFT T1.

According to an embodiment, a first initialization gate electrode G4 of the first initialization TFT T4 is connected to the previous scan line SL−1, a first initialization source electrode S4 of the first initialization TFT T4 is connected to a first initialization voltage line VL1, and a first initialization drain electrode D4 of the first initialization TFT T4 may be connected to the first electrode CE1 of the storage capacitor Cst, the compensation drain electrode D3 of the compensation TFT T3, and the driving gate electrode G1 of the driving TFT T1. The first initialization TFT T4 is turned on according to the previous scan signal Sn−1 received through the previous scan line SL−1 and performs an initialization operation of initializing a voltage of the driving gate electrode G1 of the driving TFT T1 by transmitting the initialization voltage Vint to the driving gate electrode G1 of the driving TFT T1.

According to an embodiment, an operation control gate electrode G5 of the operation control TFT T5 is connected to the emission control line EL, an operation control source electrode S5 of the operation control TFT T5 is connected to the lower driving voltage line PL, and an operation control drain electrode D5 of the operation control TFT T5 is connected to the driving source electrode S1 of the driving TFT T1 and the switching drain electrode D2 of the switching TFT T2.

According to an embodiment, an emission control gate electrode G6 of the emission control TFT T6 is connected to the emission control line EL, an emission control source electrode S6 of the emission control TFT T6 is connected to the driving drain electrode D1 of the driving TFT T1 and the compensation source electrode S3 of the compensation TFT T3, and an emission control drain electrode D6 of the emission control TFT T6 is connected to the second initialization source electrode S7 of the second initialization TFT T7 and the pixel electrode 210 of the organic light-emitting diode OLED.

According to an embodiment, the operation control TFT T5 and the emission control TFT T6 are simultaneously turned on according to the emission control signal En received through the emission control line EL so that the driving voltage ELVDD is transmitted to the organic light-emitting diode OLED and the driving current IOLED flows through the organic light-emitting diode OLED.

According to an embodiment, a second initialization gate electrode G7 of the second initialization TFT T7 is connected to the subsequent scan line SL+1, a second initialization source electrode S7 of the second initialization TFT T7 is connected to the emission control drain electrode D6 of the emission control TFT T6 and the pixel electrode 210 of the main organic light-emitting diode OLED, and the second initialization drain electrode D7 of the second initialization TFT T7 is connected to the second initialization voltage line VL2.

According to an embodiment, the scan line SL and the subsequent scan line SL+1 are electrically connected to each other so that the same scan signal Sn can be applied to the scan line SL and the subsequent scan line SL+1. Thus, the second initialization TFT T7 can be turned according to the scan signal Sn received through the subsequent scan line SL+1 and can perform an operation of initializing the pixel electrode 210 of the organic light-emitting diode OLED.

According to an embodiment, the second electrode CE2 of the storage capacitor Cst is connected to the driving voltage line PL, and a common electrode of the organic light-emitting diode OLED is connected to a common voltage ELVSS. Thus, the organic light-emitting diode OLED emits light by receiving the driving current $I_{OLED}$ from the driving TFT T1, thereby displaying an image.

In FIG. 5, according to an embodiment, the compensation TFT T3 and the first initialization TFT T4 have a dual gate electrode. However, embodiments are not limited thereto, and in other embodiments, the compensation TFT T3 and the first initialization TFT T4 have one gate electrode.

Hereinafter, the structure of one pixel PX will be described in more detail with reference to FIGS. 6, 7, and 8. FIG. 8 corresponds to some modified embodiments of FIG. 7 and will be described based on FIG. 7, and FIG. 8 will be mainly described with respect to differences from FIG. 7.

According to an embodiment, the driving TFT T1, the switching TFT T2, the compensation TFT T3, the first initialization TFT T4, the operation control TFT T5, the emission control TFT T6, and the second initialization TFT T7 are disposed on or within a semiconductor layer 1130, and some regions of the semiconductor layer 1130 form semiconductor layers of the driving TFT T1, the switching TFT T2, the compensation TFT T3, the first initialization TFT T4, the operation control TFT T5, the emission control TFT T6, and the second initialization TFT T7.

According to an embodiment, the semiconductor layer 1130 is formed on the substrate 100, and a buffer layer 110 is formed on the substrate 100, as shown in FIG. 7, and the semiconductor layer 1130 is formed on the buffer layer 110.

According to an embodiment, the substrate 100 may include glass or polymer resin. The polymer resin may be one or more of polyethersulfone (PES), polyacrylate (PAR), polyetherimide (PEI), polyethyelenene napthalate (PEN), polyethyeleneterepthalate (PET), polyphenylene sulfide (PPS), polyarylate, polyimide (PI), polycarbonate (PC), cellulose acetate triacetate (TAC), or cellulose acetate propionate (CAP). The substrate 100 that includes a polymer resin is flexible, rollable, or bendable. The substrate 100 has a multi-layer structure that includes a layer that includes the above-described polymer resin and an inorganic layer.

According to an embodiment, the buffer layer 110 reduces or blocks penetration of foreign substances, moisture or external air from a lower portion of the substrate 100 and can provide a flat surface to the substrate 100. The buffer layer 110 may include an organic material such as an oxide or a nitride, an inorganic material, or an organic/inorganic composite material and may have a single layer or a multi-layer structure of an inorganic material and an organic material.

According to an embodiment, a barrier layer is further provided between the substrate 100 and the buffer layer 110. The barrier layer prevents or minimizes penetration of impurities from the substrate 100, etc., into the semiconductor layer 1130. The barrier layer may include an organic material such as an oxide or a nitride, an inorganic material, or an organic/inorganic composite material and may have a single layer or multi-layer structure of an inorganic material and an organic material.

According to an embodiment, the semiconductor layer 1130 includes low temperature poly-silicon (LTPS). A poly-silicon material has high electron mobility (100 $cm^2/Vs$ or more), low energy power consumption and high reliability.

In another embodiment, the semiconductor layer 1130 includes amorphous silicon (a-Si) or an oxide semiconductor, and some semiconductor layers of a plurality of TFTs include LTPS, and the other semiconductor layers include amorphous silicon (a-Si) or an oxide semiconductor. In this case, a plurality of semiconductor layers 1130 are provided and are present in different layers.

According to an embodiment, a gate insulating layer 111 is positioned on the semiconductor layer 1130, and the scan line SL, the previous scan line SL−1, the subsequent scan line SL+1, and the emission control line EL are positioned on the gate insulating layer 111.

According to an embodiment, the gate insulating layer 111 includes at least one of silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

According to an embodiment, a region of the scan line SL that overlaps channel regions of the switching and compensation TFTs T2 and T3 are the switching and compensation gate electrodes G2 and G3, respectively. A region of the previous scan line SL−1 that overlaps channel regions of the first initialization TFT T4 is the first initialization gate electrode G4. A region of the subsequent scan line SL+1 that overlaps a channel region of the second initialization TFT T7 is the second initialization gate electrode G7, and regions of the emission control line EL that overlap the operation control and the emission control TFTs T5 and T6 are the operation control and emission control gate electrodes G5 and G6, respectively.

According to an embodiment, a thin-film layer 113 is provided on the scan line SL, the previous scan line SL−1, the subsequent scan line SL+1, and the emission control lines EL, and a plurality of thin-film layers 113 are provided.

According to an embodiment, as shown in FIG. 7, the thin-film layer 113 includes at least two layers, the first thin-film layer 113a and the second thin-film layer 113b, and at least one of the first thin-film layer 113a and the second thin-film layer 113b includes amorphous silicon (a-Si).

In addition, according to an embodiment, excluding the thin-film layer 113 that includes amorphous silicon (a-Si), the other thin-film layers 113 include at least one of silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

In an embodiment, the first thin-film layer 113a includes amorphous silicon (a-Si), and the second thin-film layer 113b includes silicon oxide ($SiO_x$) or silicon nitride ($SiN_x$). In another embodiment, the first thin-film layer 113a includes silicon oxide ($SiO_x$) or silicon nitride ($SiN_x$), and the second thin-film layer 113b includes amorphous silicon (a-Si).

According to an embodiment, an electrode voltage line HL, the first initialization voltage line VL1, and the second initialization voltage line VL2 are disposed on the plurality of thin-film layers 113. The electrode voltage line HL covers at least part of the driving gate electrode G1 and forms the storage capacitor Cst together with the driving gate electrode G1.

According to an embodiment, the first electrode CE1 of the storage capacitor Cst is integrally formed with the driving gate electrode G1 of the driving TFT T1. For example, the driving gate electrode G1 of the driving TFT T1 functions as the first electrode CE1 of the storage capacitor Cst. A region of the electrode voltage line HL that overlaps the driving gate electrode G1 is the second electrode CE2 of the storage capacitor Cst. Thus, the plurality of thin-film layers 113 function as a dielectric layer of the storage capacitor Cst.

In FIG. 7, according to an embodiment, the first electrode CE1 of the storage capacitor Cst is integrally formed with the driving gate electrode G1 of the driving TFT T1. However, embodiments are not limited thereto, and in other embodiments, the first electrode CE1 of the storage capacitor Cst is not integrally formed with the driving gate electrode G1 of the driving TFT T1 but is separately formed. In an embodiment, the first electrode CE1 of the storage capacitor Cst is separately formed on the same layer as the driving gate electrode G1 of the driving TFT T1.

In an embodiment, as shown in FIG. 6, the driving gate electrode G1 of the driving TFT T1 has an isolated shape.

According to an embodiment, the driving gate electrode G1 of the driving TFT T1, the first electrode CE1 of the storage capacitor Cst, and the second electrode CE2 of the storage capacitor Cst each include at least one of Al, Pt, Pd, Ag, Mg, Au, Ni, Nd, Ir, Cr, Li, Ca, Mo, Ti, W, or Cu and may have a single layer or a multi-layer structure.

According to an embodiment, an interlayer insulating layer 115 is positioned on the electrode voltage line HL, the first initialization voltage line VL1, and the second initialization voltage line VL2. The interlayer insulating layer 115 includes at least one of silicon oxide ($SiO_K$), silicon nitride ($SiN_x$), silicon oxynitride (SiON), aluminum oxide ($A_2O_3$), titanium oxide ($TiO_2$), tantalum oxide ($Ta_2O_5$), hafnium oxide ($HfO_2$), or zinc oxide ($ZnO_2$).

According to an embodiment, a data line DL, a driving voltage line PL, first and second initialization connection lines 1173a and 1173b, a node connection line 1174, and an electrode layer 1175 are positioned on the interlayer insulating layer 115. The data line DL, the driving voltage line PL, the node connection line 1174, and the electrode layer 1175 include conductive materials, such as Mo, Al, Cu, or Ti, and may have a single layer or multi-layer structure that includes the materials described above. In an example, the data line DL, the driving voltage line PL, the node connection line 1174, and the electrode layer 1175 each have a multi-layer structure of Ti/Al/Ti.

According to an embodiment, the data line DL is connected to a switching source region S2 of the switching TFT T2 through a contact hole 1154 formed in the interlayer insulating layer 115, the plurality of thin-film layers 113, and the gate insulating layer 111. Part of the data line DL connected to a switching source region S2 functions as a switching source electrode.

According to an embodiment, the driving voltage line PL is connected to the second electrode CE2 of the storage capacitor Cst via a contact hole 1158 formed in the interlayer insulating layer 115. Thus, the electrode voltage line HL has the same voltage level, which is a constant voltage, as the driving voltage line PL. In addition, the driving voltage line PL is connected to an operation control source region S5 through a contact hole 1155.

According to an embodiment, the first initialization voltage line VL1 is connected to the first initialization TFT T4 through the first initialization connection line 1173a, and the second initialization voltage line VL2 is connected to the second initialization TFT T7 through the second initialization connection line 1173b. The first initialization voltage line VL1 and the second initialization voltage line VL2 may have the same constant voltage (for example, −2V, etc.).

According to an embodiment, one end of the node connection line 1174 is connected to a compensation drain region D3 through a contact hole 1156, and the other end of the node connection line 1174 is connected to the driving gate electrode G1 through a contact hole 1157.

According to an embodiment, the electrode layer 1175 is connected to a semiconductor layer of the emission control TFT T6 through a contact hole 1153 that penetrates the interlayer insulating layer 115, the plurality of thin-film layers 113 and the gate insulating layer 111. The emission control TFT T6 is electrically connected to the pixel electrode 210 of the organic light-emitting diode OLED through the electrode layer 1175.

According to an embodiment, a planarization layer 117 is positioned on the data line DL, the driving voltage line PL, the first and second initialization connection lines 1173a and 1173b, the node connection line 1174, and the electrode layer 1175, and the organic light-emitting diode OLED is positioned on the planarization layer 117.

FIGS. 5 and 6 illustrate a structure for one pixel circuit PC, according to an embodiment. However, a plurality of pixels PX that have the same pixel circuit PC are arranged in the x-direction and the y-direction. In this case, the first initialization voltage line VL1, the previous scan line SL−1, the second initialization voltage line VL2, and the subsequent scan line SL+1 are shared by two pixel circuits PC that are adjacent to each other in the y-direction.

That is, according to an embodiment, the first initialization voltage line VL1 and the previous scan line SL−1 are electrically connected to the second initialization TFT T7 of another pixel circuit PC located on an upper portion of the pixel circuit PC shown in FIG. 6 in the y-direction of the drawings. Thus, a previous scan signal applied to the previous scan line SL−1 can be transmitted as a subsequent scan signal to the second initialization TFT T7 of another pixel circuit PC. Likewise, the second initialization voltage line VL2 and the subsequent scan line SL+1 are electrically connected to the first initialization TFT T4 of another pixel circuit PC that is adjacent to a lower portion of the pixel circuit PC shown in FIG. 6 in the y-direction of the drawings and transmits the previous scan signal and an initialization voltage.

Referring back to FIG. 7, according to an embodiment, the planarization layer 117 has a flat top surface so that the pixel electrode 210 is flat. The planarization layer 117 may have a single layer or multi-layer structure that includes an organic material. The planarization layer 117 may include a general-purpose polymer such as benzocyclobutene (BCB), polyimide, hexamethyldisiloxane (HMDSO), polymethylmethacrylate (PMMA) or polystyrene (PS), a polymer derivative that has a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. The planarization layer 117 may include an inorganic material. The planarization layer 117 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). When the planarization layer 117 includes an inorganic material, chemical planarization polishing may be performed in some cases. The planarization layer 117 may include both an organic material and an inorganic material.

According to an embodiment, the organic light-emitting diode OLED includes the pixel electrode 210, an opposite electrode 230, and an intermediate layer 220 disposed between the pixel electrode 210 and the opposite electrode 230 and that includes a light-emitting layer.

According to an embodiment, the pixel electrode 210 is connected to the electrode layer 1175 through a contact hole 1163, and the electrode layer 1175 is connected to an emission control drain region through the contact hole 1153.

According to an embodiment, the pixel electrode 210 may be a (semi-)transparent electrode or a reflective electrode. In some embodiments, the pixel electrode 210 includes a reflective layer made of Ag, Mg, Al, Pt, Pd, Au, Ni, Nd, Ir, Cr, or a compound thereof, and a transparent or semi-transparent electrode layer formed on the reflective layer. The transparent or semi-transparent electrode layer includes at least one of indium tin oxide (ITO), indium zinc oxide (IZO), zinc oxide (ZnO), indium oxide ($In_2O_3$), indium gallium oxide (IGO), or aluminum zinc oxide (AZO). In some embodiments, the pixel electrode 210 has a stack structure of ITO/Ag/ITO.

According to an embodiment, a pixel-defining layer 119 is disposed on the planarization layer 117. The pixel-defining layer 119 has an opening that exposes the center of the pixel electrode 210 that defines a light-emitting region of a pixel. In addition, the pixel-defining layer 119 increases a distance between edges of the pixel electrode 210 and the opposite electrode 230 on an upper portion of the pixel electrode 210, thereby preventing an arc, etc., from occurring in the edges of the pixel electrode 210. The pixel-defining layer 119 is formed of organic insulating materials, such as polyimide, polyamide, acryl resin, BCB, HMDSO, or phenol resin, through a method such as spin coating.

According to an embodiment, the intermediate layer 220 includes an organic light-emitting layer. The organic light-emitting layer includes an organic material that includes a fluorescent or phosphorescent material that emits red, green, blue, or white light. The organic light-emitting layer includes a low molecular weight organic material or polymer organic material, and functional layers, such as a hole transport layer (HTL), a hole injection layer (HIL), an electron transport layer (ETL), or an electron injection layer (EIL), are optionally further disposed under/on the organic light-emitting layer. The intermediate layer 220 is positioned to correspond to each of a plurality of pixel electrodes 210. However, embodiments are not limited thereto, and some embodiments, at least a part of the layers of the intermediate layer 220 are integrally formed over the plurality of pixel electrodes 210.

According to an embodiment, the opposite electrode 230 includes a transparent electrode or a reflective electrode. In some embodiments, the opposite electrode 230 is a transparent or semi-transparent electrode and is formed as a metallic thin layer having a small work function and that includes at least one of Li, Ca, LiF/Ca, LiF/Al, Al, Ag, Mg, or a compound thereof. In addition, a transparent conductive oxide (TCO) layer such as ITO, IZO, ZnO, or $In_2O_3$, may be further disposed on the metallic thin layer. The opposite electrode 230 is integrally formed so as to correspond to the plurality of pixel electrodes 210.

The display apparatus 1 according to an embodiment includes a storage capacitor Cst that includes a first electrode CE1 and a second electrode CE2, and a plurality of thin-film layers 113 are disposed between the first electrode CE1 and the second electrode CE2 of the storage capacitor Cst.

In addition, according to an embodiment, at least one of the plurality of thin-film layers 113 includes amorphous silicon (a-Si), and excluding the thin-film layer 113 that includes amorphous silicon (a-Si), the other thin-film layers 113 include at least one of silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

As shown in FIG. 7, according to an embodiment, the thin-film layers 113 include two layers, the first thin-film layer 113a and the second thin-film layer 113b. At least one of the first thin-film layer 113a and the second thin-film layer 113b includes amorphous silicon (a-Si).

In an embodiment, the first thin-film layer 113a includes amorphous silicon (a-Si), and the second thin-film layer 113b includes silicon oxide ($SiO_x$) or silicon nitride ($SiN_x$). In another embodiment, the first thin-film layer 113a includes silicon oxide ($SiO_x$) or silicon nitride ($SiN_x$), and the second thin-film layer 113b includes amorphous silicon (a-Si).

In another embodiment, as shown in FIG. 8, the thin-film layers 113 may include three layers, the first thin-film layer 113a, the second thin-film layer 113b, and a third thin-film layer 113c. At least one of the first thin-film layer 113a, the second thin-film layer 113b, and the third thin-film layer 113c includes amorphous silicon (a-Si).

In an embodiment, the second thin-film layer 113b includes amorphous silicon (a-Si), and the first thin-film layer 113a and the third thin-film layer 113c include silicon oxide ($SiO_x$) or silicon nitride (SiN).

FIGS. 7 and 8 illustrate that the thin-film layers 113 include two or three thin-film layers 113. However, embodiments are not limited thereto, and in other embodiments, the thin-film layers 113 includes four or more thin-film layers 113, and at least one of the plurality of thin-film layers 113 includes amorphous silicon (a-Si). In an embodiment, the thin-film layers 113 include five thin-film layers 113.

In a comparative example, thin-film layers disposed between a lower electrode and an upper electrode of a storage capacitor have a single layer structure. The thin-film layers disposed between the lower and upper electrodes of the storage capacitor include silicon oxide or silicon nitride.

In this case, the capacitance of the storage capacitor is maintained at a constant level. A pixel circuit included in a display apparatus sequentially has an initialization period, a threshold voltage compensation period, a data writing period, and an emission period. However, when, in the threshold voltage compensation period, the capacitance of the storage capacitor is low, and in the emission period, the capacitance of the storage capacitor is high, for high-speed driving of the pixel circuit and maintaining the pixel brightness at a substantially constant level.

However, when the thin-film layers between the lower electrode and the upper electrode of the storage capacitor have a single layer structure, the capacitance of the storage capacitor is kept constant, and the capacitance of the storage capacitor is determined so that the efficiency of one of the threshold voltage compensation period and the emission period is enhanced.

On the other hand, according to an embodiment, a plurality of thin-film layers 113 are included between the first electrode CE1 and the second electrode CE2 of the storage capacitor Cst. In addition, at least one of the plurality of thin-film layers 113 includes amorphous silicon (a-Si), and excluding the thin-film layer 113 that includes amorphous silicon (a-Si), the other thin-film layers 113 include silicon oxide ($SiO_x$) or silicon nitride ($SiN_x$).

In this case, when the pixel circuit PC is driven, in the threshold voltage compensation period, the capacitance of the storage capacitor Cst decreases for enhanced charging of the driving TFT T1, and in the emission period, the capacitance of the storage capacitor Cst increases for enhanced voltage maintenance of the driving gate electrode G1 of the driving TFT T1.

That is, according to an embodiment, the capacitance of the storage capacitor Cst can vary. When the driving efficiency of the pixel circuit PC can be enhanced only when the capacitance of the storage capacitor Cst is low, the capacitance of the storage capacitor Cst is low, and when the driving efficiency of the pixel circuit PC can be enhanced only when the capacitance of the storage capacitor Cst is high, the capacitance of the storage capacitor Cst is increased.

In detail, according to an embodiment, as the capacitance of the storage capacitor Cst increases in the emission period, the brightness of the organic light-emitting diode OLED can be maintained at close to 100% while the emission period progresses. As the capacitance of the storage capacitor Cst decreases in the threshold voltage compensation period, the charging time of the driving TFT T1 is reduced so that pixel circuit PC can be driven at a higher speed driving, and a time interval during which an instantaneous afterimage is displayed in the display area (see DA of FIG. 1) is reduced. This will be described in detail with reference to FIGS. 11 through 13.

Figure 9:
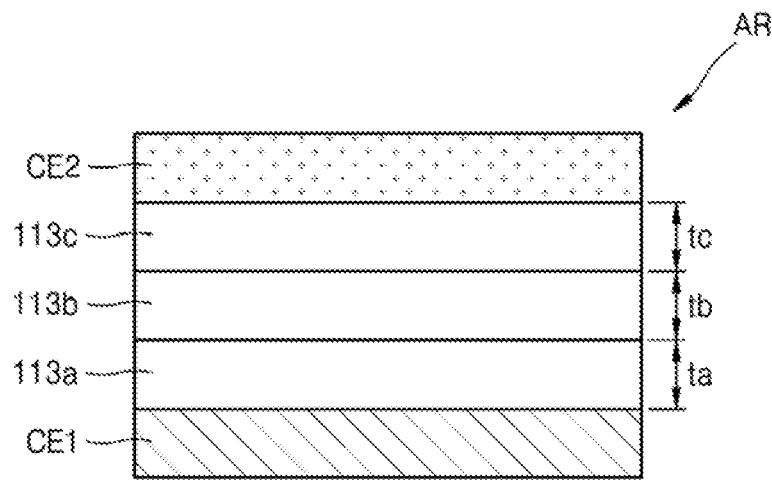
FIG. 9 is an enlarged view of part of FIG. 8.
Figure 10:
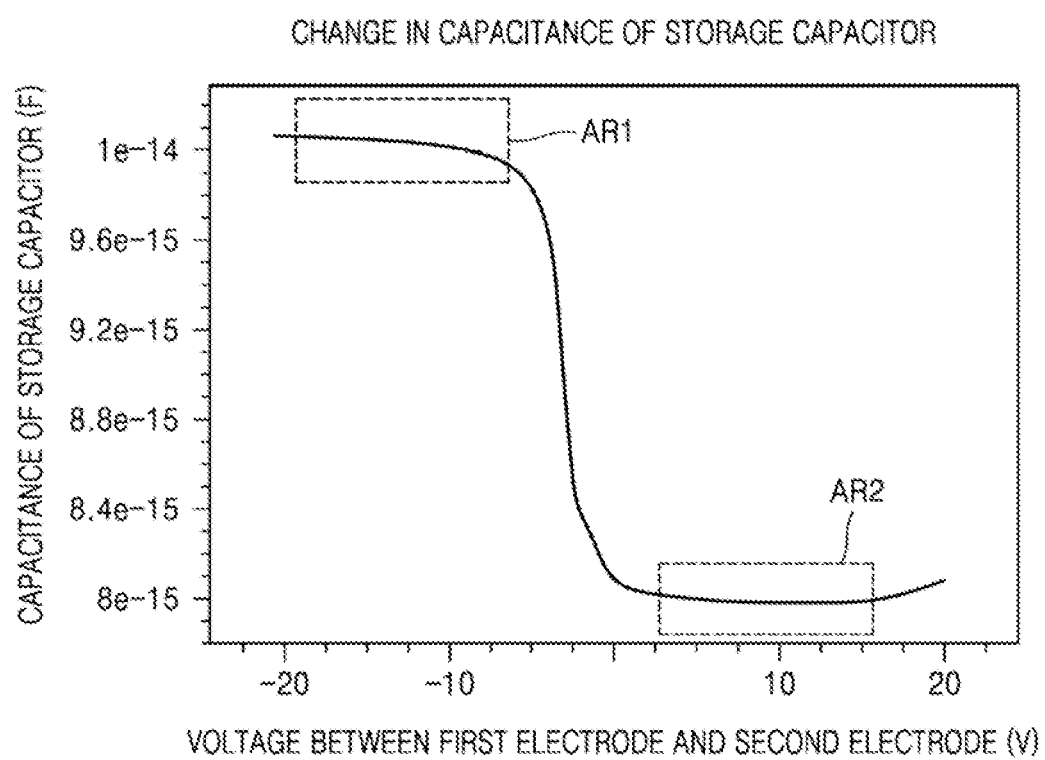
FIG. 10 is a graph that illustrates a change in capacitance of a storage capacitor according to an embodiment.

FIG. 9 is an enlarged view of part of FIG. 8, and FIG. 10 is a graph that illustrates a change in capacitance of a storage capacitor according to an embodiment.

In detail, according to an embodiment. FIG. 9 is an enlarged view of part AR of the storage capacitor Cst and the plurality of thin-film layers 113 shown in FIG. 8. The thin-film layers 113 include three layers, the first thin-film layer 113a, the second thin-film layer 113b, and the third thin-film layer 113c, and at least one of the first thin-film layer 113a, the second thin-film layer 113b, and the third thin-film layer 113c includes amorphous silicon (a-Si). In an embodiment, the second thin-film layer 113b includes amorphous silicon (a-Si), and the first thin-film layer 113a and the third thin-film layer 113c include silicon oxide ($SiO_x$) or silicon nitride ($SiN_x$).

According to an embodiment, when the second thin-film layer 113b includes amorphous silicon (a-Si), the capacitance of the storage capacitor Cst is calculated by using a first thickness ta of the first thin-film layer 113a, a second thickness tb of the second thin-film layer 113b, a third thickness tc of the third thin-film layer 113c, a first dielectric constant $\varepsilon_1$ of the first thin-film layer 113a and the third thin-film layer 113c, and a second dielectric constant $\varepsilon_2$ of the second thin-film layer 113b. This is expressed by Equations 1 and 2.

$$Cst' \cong \frac{\varepsilon_1}{ta+tc}A \quad \text{[Equation 1]}$$

$$Cst'' \cong \frac{\varepsilon_1}{ta+tc+\frac{\varepsilon_1}{\varepsilon_2}tb}A \quad \text{[Equation 2]}$$

Equation 1 is an equation for the capacitance during the emission period and corresponds to the case where the amorphous silicon (a-Si) in the second thin-film layer 113b is in an accumulation state. Equation 2 is an equation for the capacitance during the threshold voltage compensation period and corresponds to the case where the amorphous silicon (a-Si) in the second thin-film layer 113b is in a depletion state. Here, "A" in Equations 1 and 2 represents the area of the storage capacitor Cst illustrated in FIG. 6.

In addition, in an embodiment in which the first thin-film layer 113a and the third thin-film layer 113c include the same material, the dielectric constants of the first thin-film layer 113a and the third thin-film layer 113c are equal to the first dielectric constant $\varepsilon_1$. However, the first thin-film layer 113a and the third thin-film layer 113c may include different materials. In this case, dielectric constants of the first thin-film layer 113a and the third thin-film layer 113c may differ from each other. In an embodiment, the first thin-film layer 113a includes silicon oxide, and the third thin-film layer 113c includes silicon nitride, and the dielectric constant of the third thin-film layer 113c is greater than the dielectric constant of the first thin-film layer 113a.

According to an embodiment, the duration of the emission period is greater than that of the threshold voltage compensation period, and a constant voltage is applied to the storage capacitor Cst during the duration of the emission period. In this case, the amorphous silicon (a-Si) in the second thin-film layer 113b is in an accumulation state and has properties similar to that of a metal. Thus, when a first capacitance Cst' of the storage capacitor Cst is calculated as an approximation to the value in Equation 1, the second thickness tb of the second thin-film layer 113b is excluded.

According to an embodiment, the duration of the threshold voltage compensation period is less than that of the emission period, and a lower voltage is applied to the storage capacitor Cst. In this case, the amorphous silicon (a-Si) in the second thin-film layer 113b is in a depletion state and has properties similar to that of a dielectric substance. Thus, when a second capacitance Cst" of the storage capacitor Cst is calculated as an approximation to the value in Equation 2, the second thickness tb of the second thin-film layer 113b is included.

According to an embodiment, when Equation 1 and Equation 2 are compared to each other, the first capacitance Cst' of the storage capacitor Cst by Equation 1 is greater than the second capacitance Cst" of the storage capacitor Cst by Equation 2. This is because the second thickness tb of the second thin-film layer 113b is a denominator term not included in Equation 1 that is further present in Equation 2, thus decreasing the value of the overall second capacitance Cst". Thus, the first capacitance Cst' is greater than the second capacitance Cst".

Referring to FIG. 10, according to an embodiment, when a plurality of thin-film layers 113 are arranged between the first electrode CE1 and the second electrode CE2 of the storage capacitor Cst, and at least one of the plurality of thin-film layers 113 includes amorphous silicon (a-Si), the capacitance values of the storage capacitor Cst according to a voltage applied to the first electrode CE1 and the second electrode CE2 of the storage capacitor Cst can be determined.

In detail, according to an embodiment, a first area AR1 indicated in FIG. 10 corresponds to the emission period in which a voltage applied to the first electrode CE1 and the second electrode CE2 of the storage capacitor Cst is about $-10V$, and a second area AR2 corresponds to the threshold voltage compensation period in which a voltage applied to the first electrode CE1 and the second electrode CE2 of the storage capacitor Cst is about $+10V$.

Referring to the first area AR1, according to an embodiment, in the emission period, the capacitance of the storage capacitor Cst is about $10^{-14}$ F. In addition, referring to the second area AR2, in the threshold voltage compensation period, the capacitance of the storage capacitor Cst is about $8 \times 10^{-15}$ F.

That is, when the thin-film layers 113 that including amorphous silicon (a-Si) are disposed between the first electrode CE1 and the second electrode CE2 of the storage capacitor Cst, the capacitance of the storage capacitor Cst in the emission period is greater than the capacitance of the storage capacitor Cst in the threshold voltage compensation period. It may be seen that this is consistent with the results derived by Equations 1 and 2 described with regard to FIG. 9.

According to an embodiment, enhancement in driving the pixel circuit PC when the capacitance of the storage capacitor Cst in the emission period is high and when the capacitance of the storage capacitor Cst in the threshold voltage compensation period is low, will be described in FIGS. 11 through 14.

Figure 11:
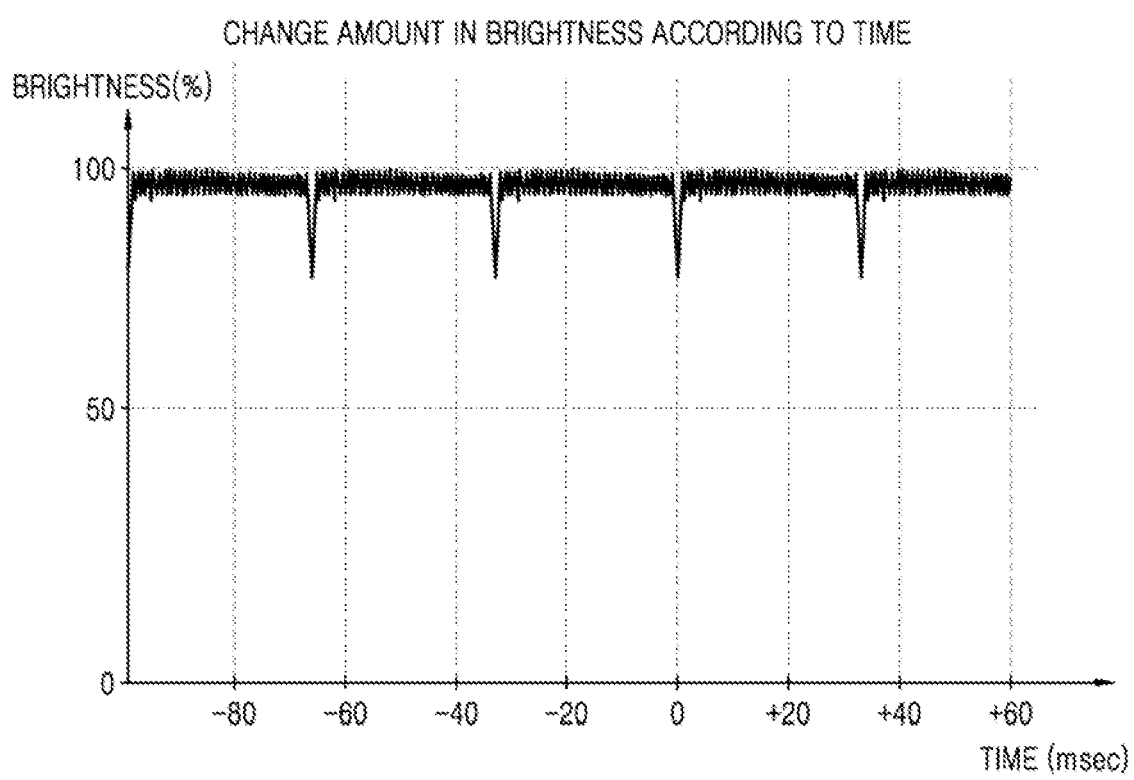
FIG. 11 is a graph that illustrates a change in brightness according to an embodiment.

FIG. 11 is a graph showing a change in brightness according to an embodiment.

In detail, according to an embodiment, a change in brightness according to the emission period is known. Here, a time from the emission period to the next emission period corresponds to about 33 ms, and the capacitance of the storage capacitor Cst increases by about 10% or more compared to a pre-existing capacitance.

Referring to FIG. 11, according to an embodiment, when the capacitance of the storage capacitor Cst increases, a change in brightness of the organic light-emitting diode OLED during the emission period is minute. That is, the brightness during the about 33 ms of the emission period can be maintained to a value close to 100%. In an example, the capacitance of the storage capacitor Cst is about 55 through 75 fF.

According to an embodiment, because the storage capacitor Cst is connected to the driving TFT T1, even when a voltage does not instantaneously flow through the data line DL, the storage capacitor Cst maintains the voltage of the driving TFT T1, so that the organic light-emitting diode OLED can continuously emit light. In this case, increasing the capacitance of the storage capacitor Cst helps to maintain a voltage of the driving TFT T1. Thus, a change in brightness of the organic light-emitting diode OLED is minute.

Figure 12:
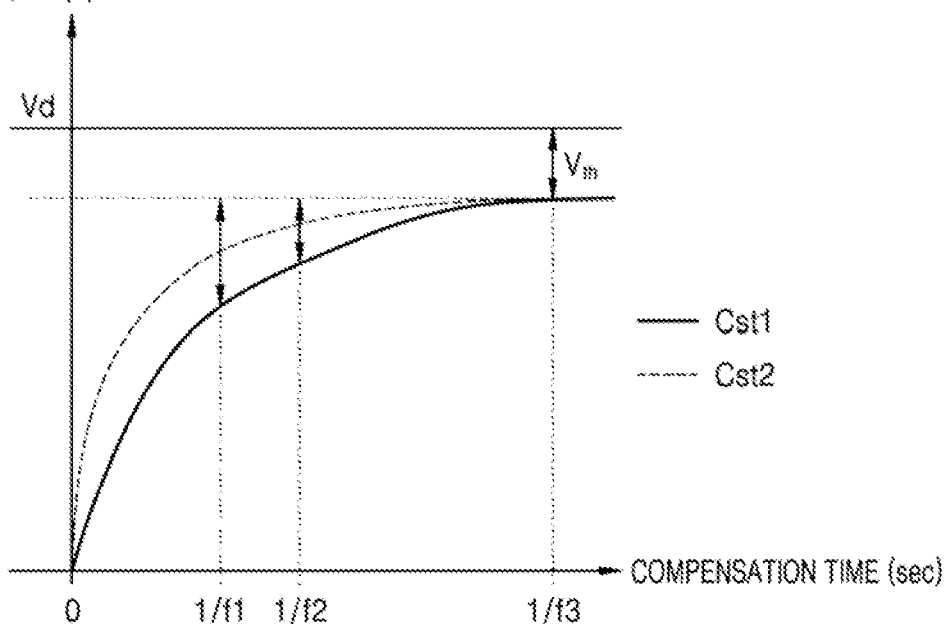
FIG. 12 is a graph that illustrates changes in compensation time according to an embodiment.
Figure 13:
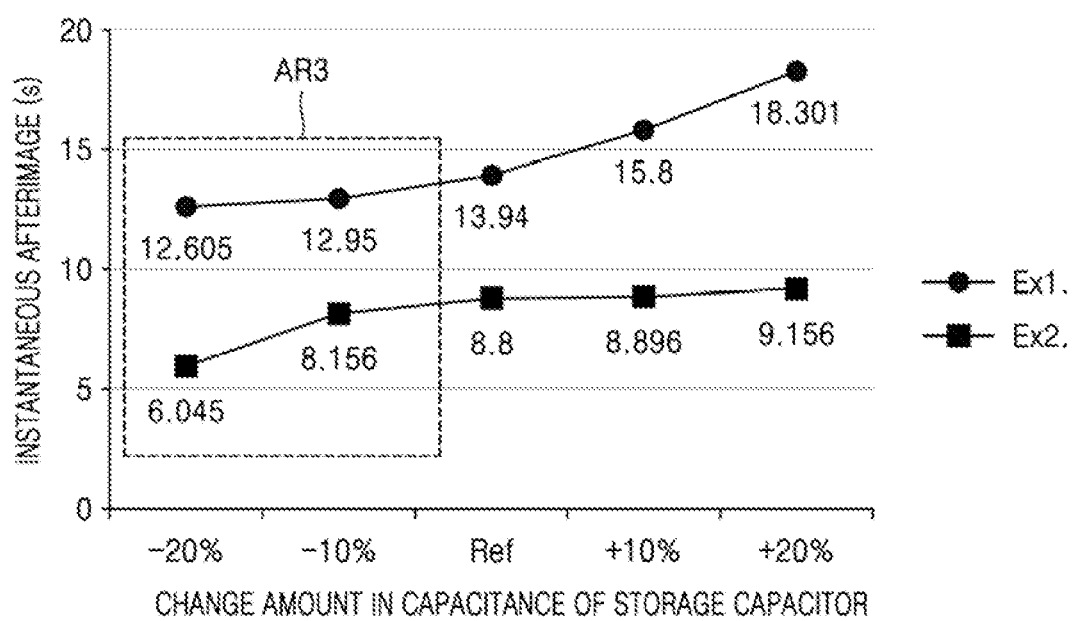
FIG. 13 is a graph that illustrates changes in an instantaneous afterimage according to an embodiment.

FIG. 12 is a graph that illustrates changes in a compensation time according to an embodiment, and FIG. 13 is a graph that illustrates changes in an instantaneous afterimage according to an embodiment.

Referring to FIG. 12, according to an embodiment, a pixel circuit PC sequentially has an initialization period, a threshold voltage compensation period, a data writing period, and an emission period. During the threshold voltage compensation period, a compensation time for a voltage Vg of a driving gate electrode G1 of a driving TFT T1 according to the capacitance of a storage capacitor Cst to reach a voltage obtained by subtracting a threshold voltage Vth from a voltage Vd applied from a data line DL can be checked.

According to an embodiment, changes, which correspond to a solid line of FIG. 12, in the voltage Vg of the driving gate electrode G1 of the driving TFT T1 when the storage capacitor Cst has a first capacitance Cst1, and changes, which correspond to a dotted line of FIG. 12, in the voltage Vg of the driving gate electrode G1 of the driving TFT T1 when the storage capacitor Cst has a second capacitance Cst2, are compared to each other. In this case, the first capacitance Cst1 is greater than the second capacitance Cst2.

According to an embodiment, a compensation time for the voltage Vg of the driving gate electrode G1 of the driving TFT T1 when the storage capacitor Cst has the second capacitance Cst2 to reach a voltage obtained by subtracting the threshold voltage Vth from the voltage Vd received from the data line DL, is 1/f1 sec or 1/f2 sec.

According to an embodiment, a compensation time for the voltage Vg of the driving gate electrode G1 of the driving TFT T1 when the storage capacitor Cst has the first capacitance Cst1 to reach a voltage obtained by subtracting the threshold voltage Vth from the voltage Vd received from the data line DL, is 1/f3 sec. A compensation time for the voltage Vg of the driving gate electrode G1 when the storage capacitor Cst has the second capacitance Cst2 to reach a voltage obtained by subtracting the threshold voltage Vth from the voltage Vd received from the data line DL is less than a time for the voltage Vg of the driving gate electrode G1 of the driving TFT T1 when storage capacitor Cst has the first capacitance Cst1 and the second capacitance Cst2, respectively, to reach a voltage obtained by subtracting the threshold voltage Vth from the voltage Vd received from the data line DL.

According to an embodiment, as the capacitance of the storage capacitor Cst decreases, a time for the voltage Vg of the driving gate electrode G1 to reach a voltage obtained by subtracting the threshold voltage Vth from the voltage Vd received from the data line DL is reduced. That is, as the capacitance of the storage capacitor Cst decreases, the time interval for charging of the voltage Vg of the driving gate electrode G1 deceases, which allows a high-speed driving of the pixel circuit PC.

Referring to FIG. 13, according to an embodiment, changes in an instantaneous afterimage according to the capacitance of the storage capacitor Cst are known. An instantaneous afterimage time according to the capacitance of the storage capacitor Cst has been measured by using a first product Ex1. and a second product Ex2. The second product Ex2. corresponds to the case where a light blocking layer is further included in the first product Ex1.

Looking at the duration of the instantaneous afterimage according to the capacitance of the storage capacitor Cst, it may be seen that the instantaneous afterimage time duration increases as the capacitance increases. That is, referring to a third area AR3 indicated in FIG. 13, when the capacitance of the storage capacitor Cst decreases by about 10% compared to preset capacitance Ref, an instantaneous after image of the first product Ex1. is maintained for about 12.95 sec, and an instantaneous afterimage of the second product Ex2. may be maintained for about 8.156 sec.

According to an embodiment, when the capacitance of the storage capacitor Cst decreases by about 20% compared to the preset capacitance Ref, the instantaneous afterimage of the first product Ex1. is maintained for about 12.605 sec, and the instantaneous afterimage of the second product Ex2. is maintained for about 6.045 sec.

That is, when the capacitance of the storage capacitor Cst decreases by about 10% to 20% compared to the preset capacitance Ref, the duration of instantaneous afterimage of both the first product Ex1. and the second product Ex2. is reduced. Thus, as the capacitance of the storage capacitor Cst decreases, a time interval during which the instantaneous afterimage is displayed is reduced.

According to an embodiment, a plurality of thin-film layers are disposed between the first electrode CE1 and the second electrode CE2 of the storage capacitor Cst, and at least one of the plurality of thin-film layers 113 includes amorphous silicon (a-Si). In this case, when the pixel circuit PC is driven, the capacitance of the storage capacitor Cst can vary.

Until now, a display apparatus according to some embodiments has been mainly described. However, embodiments are not limited thereto. For example, a method of manufacturing the display apparatus also falls within the scope of embodiments of the present disclosure.

According to an embodiment described above, a thin-film transistor substrate is provided for high-speed driving of a pixel circuit and maintaining the brightness of a pixel, and a display apparatus including the thin-film transistor substrate can be implemented. The scope of embodiments of the present disclosure is not limited by these effects.

It should be understood that exemplary embodiments described herein should be considered in a descriptive sense only and not for purposes of limitation. Descriptions of features or aspects within each embodiment should typically be considered as available for other similar features or aspects in other embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A thin-film transistor substrate, comprising:
   a semiconductor layer disposed on a substrate;
   a gate insulating layer disposed on the semiconductor layer;
   a first electrode that at least partly overlaps the semiconductor layer, wherein the gate insulating layer is disposed between the first electrode and the semiconductor layer;
   a plurality of thin-film layers disposed on the first electrode; and
   a second electrode that at least partly overlaps the first electrode, wherein the plurality of thin-film layers are disposed between the second electrode and the first electrode,
   wherein at least one of the plurality of thin-film layers includes amorphous silicon, and
   wherein a capacitance of a storage capacitor that includes the first electrode and the second electrode varies.

2. The thin-film transistor substrate of claim 1, wherein the plurality of thin-film layers include a first thin-film layer, a second thin-film layer, and a third thin-film layer that are sequentially stacked, and the second thin-film layer includes amorphous silicon.

3. The thin-film transistor substrate of claim 2, wherein the first thin-film layer and the third thin-film layer include different materials from each other.

4. The thin-film transistor substrate of claim 2, wherein the first thin-film layer and the third thin-film layer include a same material.

5. The thin-film transistor substrate of claim 1, wherein the plurality of thin-film layers include a first thin-film layer and a second thin-film layer that are sequentially stacked, and one of the first thin-film layer or the second thin-film layer includes amorphous silicon.

6. The thin-film transistor substrate of claim 1, wherein, excluding a thin-film layer that includes amorphous silicon, the other thin-film layers include silicon oxide or silicon nitride.

7. The thin-film transistor substrate of claim 1, wherein, when a voltage is charged to the first electrode, the capacitance of the storage capacitor decreases.

8. The thin-film transistor substrate of claim 1, further comprising:
a thin-film transistor that includes the semiconductor layer and the first electrode as a gate electrode; and
a storage capacitor that includes the first electrode and the second electrode,
wherein the thin-film transistor and the storage capacitor overlap, and the gate electrode has an isolated shape.

9. The thin-film transistor substrate of claim 1, wherein the semiconductor layer includes a silicon semiconductor material or an oxide semiconductor material.

10. A display apparatus, comprising:
a storage capacitor, a thin-film transistor, and a display element electrically connected to the thin-film transistor that are disposed on a substrate, wherein
the storage capacitor includes a first electrode and a second electrode that at least partly overlap each other, and
a plurality of thin-film layers are disposed between the first electrode and the second electrode, and at least one of the plurality of thin-film layers includes amorphous silicon,
wherein a first capacitance of the storage capacitor when a voltage charged to the thin-film transistor differs from a second capacitance of the storage capacitor when the display element emits light.

11. The display apparatus of claim 10, wherein, when the display element emits light, capacitance of the storage capacitor is increased, and when a voltage is charged to the first electrode, the capacitance of the storage capacitor decreases.

12. The display apparatus of claim 10, wherein the first capacitance of the storage capacitor is less than the second capacitance of the storage capacitor.

13. The display apparatus of claim 10, wherein the thin-film transistor includes a semiconductor layer and a gate electrode, the thin-film transistor overlaps the storage capacitor, and the gate electrode functions as the first electrode.

14. The display apparatus of claim 10, wherein the plurality of thin-film layers include a first thin-film layer, a second thin-film layer, and a third thin-film layer that are sequentially stacked, and the second thin-film layer includes amorphous silicon.

15. The display apparatus of claim 14, wherein the first thin-film layer and the third thin-film layer include different materials from each other or a same material.

16. The display apparatus of claim 10, wherein, excluding a thin-film layer that includes amorphous silicon, the other thin-film layers include silicon oxide or silicon nitride.

17. The display apparatus of claim 10, wherein the plurality of thin-film layers include a first thin-film layer and a second thin-film layer that are sequentially stacked, and one of the first thin-film layer or the second thin-film layer includes amorphous silicon.

18. A thin-film transistor substrate, comprising:
a thin-film transistor that includes a semiconductor layer and a gate electrode,
a plurality of thin-film layers disposed on the gate electrode; and
a second electrode disposed on the plurality of thin-film layers wherein the second electrode at least partly overlaps the gate electrode,
wherein at least one of the plurality of thin-film layers comprises amorphous silicon, and the other thin-film layers comprise silicon oxide or silicon nitride.

19. The thin-film transistor substrate of claim 18, wherein the gate electrode forms a storage capacitor with the second electrode, and a capacitance of the storage capacitor varies.

* * * * *